(12) United States Patent
Miyake

(10) Patent No.: US 7,161,817 B2
(45) Date of Patent: Jan. 9, 2007

(54) CURRENT/CHARGE-VOLTAGE CONVERTER AND RESET METHOD

(75) Inventor: Yasuhiro Miyake, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 100 days.

(21) Appl. No.: 10/982,565

(22) Filed: Nov. 4, 2004

(65) Prior Publication Data

US 2005/0105310 A1    May 19, 2005

(30) Foreign Application Priority Data

Nov. 14, 2003 (JP) ............................. 2003-385098

(51) Int. Cl.
*H02M 7/00*    (2006.01)

(52) U.S. Cl. .................. 363/73; 327/530; 363/178

(58) Field of Classification Search .................. 363/73, 363/74, 178; 323/299; 327/530
See application file for complete search history.

(56) References Cited

FOREIGN PATENT DOCUMENTS

| JP | 03-200121 | 9/1991 |
|---|---|---|
| JP | 2002-221540 | 8/2002 |
| SU | 1352600 A | * 11/1987 |

* cited by examiner

*Primary Examiner*—Karl Easthom
*Assistant Examiner*—Richard V. Muralidar

(57) ABSTRACT

A current/charge-voltage converter having an operational amplifier and a first capacitor connected between the input terminal and the output terminal of the operational amplifier, comprising a first switch which has one end connected to this input terminal, a first signal source that generates control signals for the first switch, a second capacitor connected to the first capacitor, and a second signal source connected to the other terminal of the second capacitor.

6 Claims, 3 Drawing Sheets

CURRENT/CHARGE-VOLTAGE CONVERTER AND RESET METHOD

BACKGROUND OF THE INVENTION

1. Field of the Invention

The present invention relates to a current/charge-voltage converter that uses an integrating circuit and in particular, to a current/charge converter that comprises a means for resetting the charge that has accumulated in the integrating capacitor to a specific voltage.

2. Discussion of the Background Art

Current/charge-voltage converters that have integrating circuits are used in current measuring devices, charge measuring devices, and other devices. These are circuits wherein, as shown in the integrating circuit 1 of FIG. 2, an integrating capacitor 11 is connected between the inverted input terminal and output terminal of an operational amplifier 10, integrating capacitor 11 is charged by current from the current source of device under test 3, the amount of charge is measured by measuring the integrated voltage V, and the amount of current is measured by finding the change in integrated voltage V. The current/charge-voltage converter of the present invention encompasses both current-voltage conversion, as well as charge-voltage conversion.

When plural charges or currents are measured using the integrating circuit in FIG. 2, it is necessary to reset capacitor 11 so that capacitor 11 does not become saturated. In general, this reset operation involves discharging the charge that has accumulated in capacitor 11 and resetting the output voltage Vo to 0 V, and it becomes necessary to reset the voltage between the two terminals of capacitor 11 to a specific voltage when the polarity of the measured signals is known in advance, when there is an output voltage limit that we can measure with a high degree accuracy, and the like.

The technology cited in JP (Kokai) 3[1991]-200,121 is a current/charge-voltage converter having the function of resetting the output voltage Vo to a specific voltage. This circuit will be generally described based on the schematic representation in FIG. 2. The current-voltage conversion current can be divided into an integrating circuit 1 and a reset circuit 2. A current source of the device under test 3 is connected to integrating circuit 1. On the other hand, reset circuit 2 is connected between the two terminals of integrating capacitor 11 and has the function of resetting the voltage of the capacitor. Reset circuit 2 comprises an FET switch 23, a control signal source 25 of switch 23, an operational amplifier 27 connected to switch 23, and a signal source 28 that applies the reset voltage. When the output of control signal source 25 is 0 V, the gate voltage of FET 23 becomes 0 V; therefore, the drain-source is in a disconnected state and reset circuit 2 is in a non-operating state.

On the other hand, when a positive voltage is applied to control signal source 25, the drain-source of FET 23 is in a connected state. The potential of the noninverted input terminal of operational amplifier 27 and junction A becomes the same voltage as the inverted input terminal at this time. Therefore, the noninverted input terminal and junction A become the same potential as the output voltage V2 of signal source 28. In addition, the output voltage of operational amplifier 27 and the potential of junction B become 0 V because they are connected to the inverted input terminal of an operational amplifier 10. Moreover, both terminals of capacitor 11 are reset to V2, which is the potential difference between junctions A and B.

Thus, the circuit in FIG. 2 can charge capacitor 11 to a specific voltage. However, there is a floating capacitor 26 of capacitance value C1 between the control terminal (gate in FIG. 2) and the terminal to be controlled (source in FIG. 2) of FET switch 23, as well as analog switches, relays, and other types of switches. Therefore, when the voltage of control signal source 25 changes, current flows to the source terminal. That is, current flows to the source terminal at the instant when switch 23 is turned off. There is a problem in that because this current flows into capacitor 11, the output voltage Vo (the voltage between the two terminals of capacitor 11) changes after switch 23 has been turned off and becomes a potential that is different from the reset voltage V2. In particular, a capacitor 11 with a small capacitance is used for improved accuracy in devices that measure microcurrent (or microcharge); as a result, there are large changes in the output voltage Vo with the source current that flows when switch 23 is turned off.

SUMMARY OF THE INVENTION

The present invention solves the above-mentioned problems with a current/charge-voltage converter having an operational amplifier and first capacitor connected between the input terminal and output terminal of this operational amplifier, comprising a first switch which has one end connected to this input terminal, a first signal source that generates control signals for this first switch, a second capacitor connected to this first capacitor, and a second signal source connected to the other terminal of this second capacitor.

That is, changes in the output voltage when the switch is turned off are prevented by applying current from a second signal source in the opposite direction of the current that is generated by changes in control signals when the switch is turned off.

The voltage after reset can be accurately set at a predetermined voltage by the current/charge-voltage converter or method of the present invention.

DETAILED DESCRIPTION OF THE PREFERRED EMBODIMENT

A current/charge-voltage converter that is the preferred embodiment of the present invention will be described in detail while referring to the attached drawings.

Figure 1:
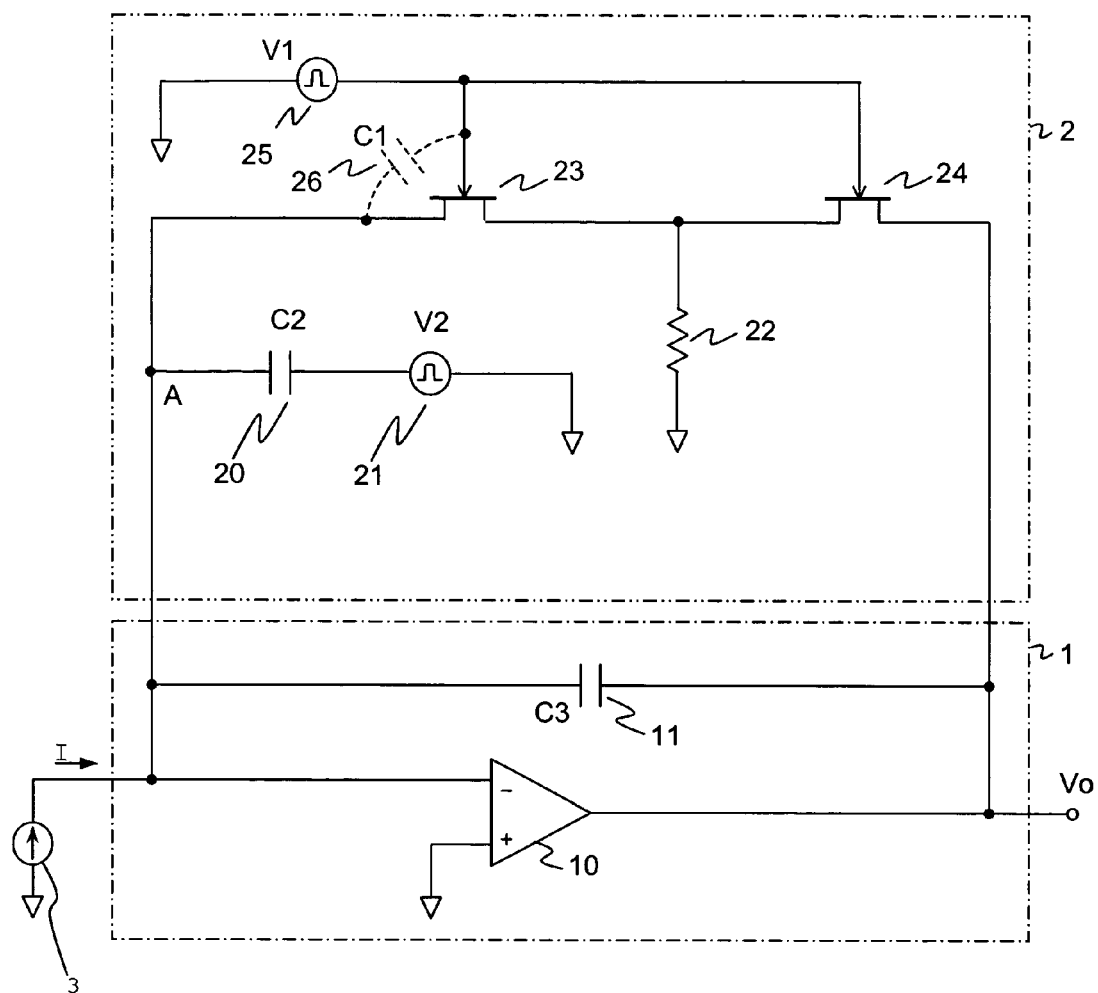
FIG. 1 is a circuit diagram of the current/charge-voltage converter that is a working example of the present invention.
Figure 2:
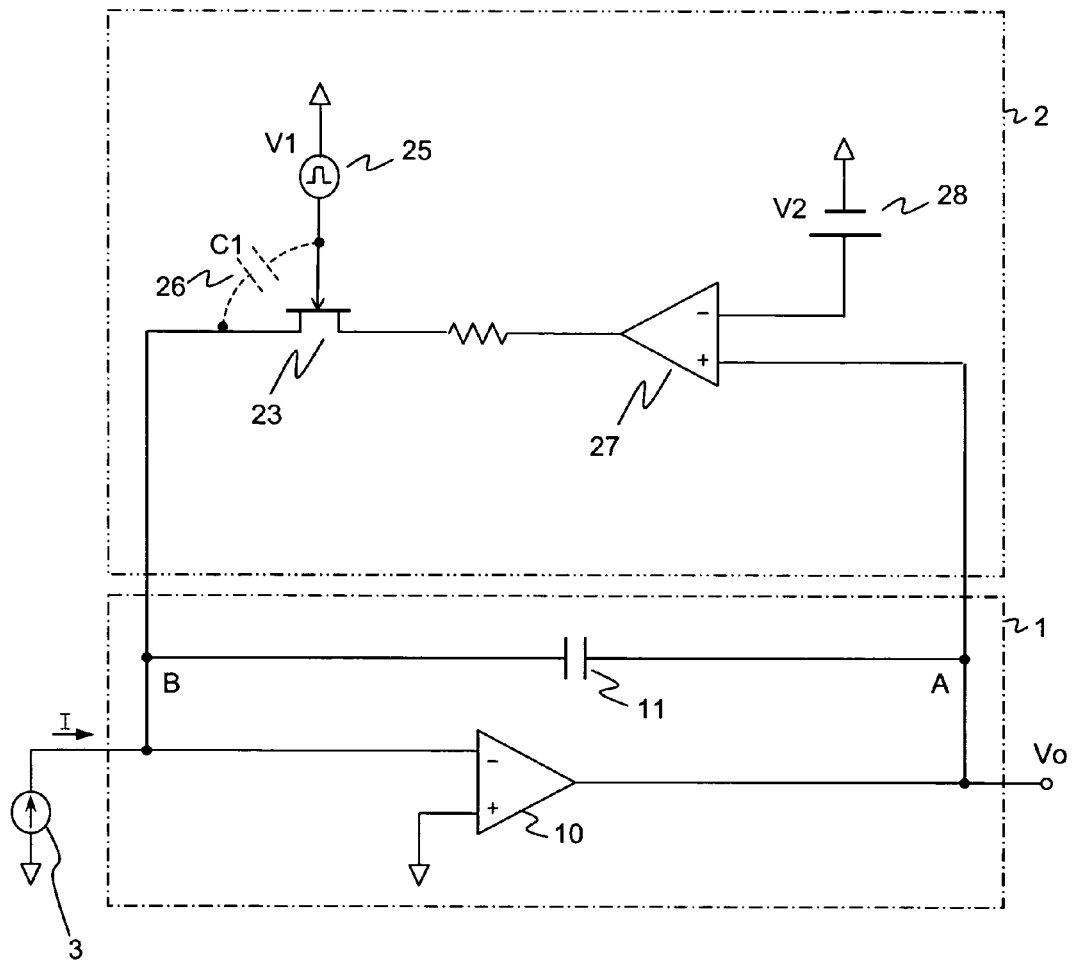
FIG. 2 is a circuit diagram of the current/charge-voltage converter cited in the prior art.

FIG. 1 is a circuit diagram of the current/charge-voltage converter pertaining to the present invention. The current/charge-voltage converter comprises an integrating circuit 1 and a reset circuit 2. Integrating circuit 1 comprises an operational amplifier 10 capable of output within a range of −2 V to 2 V and a 10-pF integrating capacitor 11 connected between the inverted input terminal and output terminal of operational amplifier 10. A current source [of a device] under test 3 is connected to the input terminal of operational amplifier 10. Moreover, reset circuit 2 comprises FET switches 23 and 24 connected to the input and output terminals of operational amplifier 10, respectively, a resistor 22 connected to the other terminal of FET switches 23 and 24, a control signal source 25 that supplies control signals to FET switches 23 and 24, a capacitor 20 connected to the inverted input terminal side of capacitor 11, and a reset voltage source 21 connected to the other terminal of capacitor 20.

It should be noted that FETs are used for switches 23 and 24 in this working example, but analog switches, relays, or other switches can also be used.

The operation of the circuit will now be described using the circuit diagram in FIG. 1 and the timing chart in FIG. 3. The inverted input terminal of operational amplifier 10 of integrating circuit 1 is in a state of high impedance; therefore, current from the current source of device under test 3 accumulates in integrating capacitor 11. The noninverted terminal is grounded; therefore, the inverted terminal is at 0 V due to virtual grounding. The charge Q supplied from the current source of device under test 3 can be found by Q=C3×Vo. (C3 is the capacitance of capacitor 11 and V is the output voltage of operational amplifier 10). Moreover, the current I can be found from the change in charge Q per unit of time, or I=C×dVo/dt. As a result, the charge Q and the current I supplied from the current source of device under test 3 can be measured by measuring the output voltage V.

Figure 3:
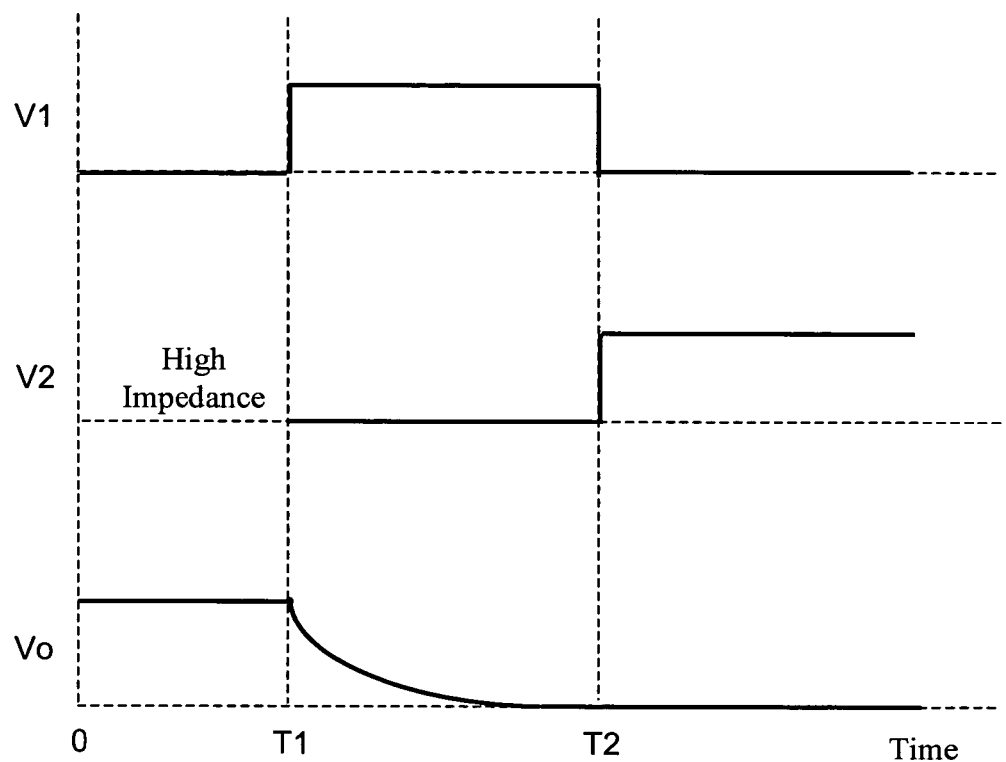
FIG. 3 is the timing pattern for each signal in the working example of the present invention.

On the other hand, reset circuit 2 brings the control signal voltage V1 to 0V and turns off both FET switches 23 and 24 when the current source of device under test 3 is being measured (between times 0 and T1 in FIG. 3). Reset voltage source 21 is brought to high impedance at this time and the current does not leak from the current source of device under test 3 to reset circuit 2.

Next, the control signal voltage V1 is brought to 5 V at time T1 when capacitor 11 is reset (between times T1 and T2 in FIG. 3). As a result, both FET switches 23 and 24 are turned on. One terminal of both FET switches 23 and 24 is connected to capacitor 11, while the other terminal is grounded via resistor 22. Therefore, the charge that has accumulated in capacitor 11 is eliminated until the voltage between the two terminals of capacitor 11 is brought to 0 V in accordance with a time constant determined from the capacitance of capacitor 11 and the combined resistance of resistor 22 and FETs 23 and 24.

When charge elimination is completed, the control signal voltage V1 returns to 0 V and both FET switches 23 and 24 are turned off (time T2 in FIG. 3). Source current flows to FET 23 due to changes in the control signal voltage V1 when floating capacitor 26 is present between the gate and the source at this time. Therefore, when FET switches 23 and 24 are turned off, reset voltage source 21 simultaneously changes from 0 V to 5 V and current in the opposite direction of the source current is supplied through capacitor 20 having the same capacitance as gate-source capacitor 26 to junction A. As a result, the charge supplied from the source current when FET switch 23 is turned off is canceled and capacitor 11 is kept in a state of eliminated charge (the voltage between the two terminals is 0 V).

It should be noted that the capacitance C1 of gate-source floating capacitor 26 and the capacitance C2 of capacitor 20, and the control signal voltage V1 and the voltage V2 of the reset power source are set so that each is the same in the present working example. However, they can be set as needed within a range that establishes C1×V1=−C2×V2, that is, such that the charge supplied through gate-source floating capacitor 26 to the source terminal of FET 23 due to changes in the control signal voltage V1 and the charge supplied through capacitor 20 due to changes in the voltage V2 of the reset power source are equal.

Moreover, the effect of the source current that flows when switch 23 is turned off can be canceled and capacitor 11 can be reset to a specific voltage Vo by setting the capacitance C2 of capacitor 20, the capacitance C3 of integrating capacitor 11, the control signal voltage V1, and the reset power source voltage V2 such that C1×V1+C2×V2=C3×Vo. For instance, when it is known that the current I of the current source of device under test 3 is in the direction shown by the arrow in FIG. 1, it is possible to measure using the entire range of output voltages of operational amplifier 10 (−2V to 2V) by resetting the voltage between the two terminals of capacitor 11 to −2V, which is the lower limit of the output voltage range of operational amplifier 10; as a result, more precise measurement becomes possible.

The current source of device under test 3 of the present invention includes active current sources that supply the current themselves, as well as resistors, capacitors, and other passive elements that supply current by application of voltage from the outside. When testing this type of passive element, the test is conducted with the power source inserted between the ground potential of integrating circuit 1 and reset circuit 2 and the ground potential of the current source of device under test 3. For instance, when the resistance R of a resistor is to be measured, the resistor is set in the position of the current source of device under test 3, a power source is inserted at the grounded part of integrating circuit 1 and reset circuit 2, and a voltage difference Vin is set up between the grounded potential of integrating circuit 1 and reset circuit 2 and the grounded potential of the current source of device under test 3. The voltage of the inverted terminal of operational amplifier 10 at this time becomes Vin and the constant current I determined from the voltage difference Vin and resistance R (I=Vin/R) therefore flows to the resistor under test. That is, the resistor under test acts in the same way as the current source of device under test as in the above-mentioned working example. It is possible to measure resistance R by finding this current I. At the same time, it is possible to apply the same bias voltage as in a state of actual use by establishing a potential difference between the grounded potential of integrating circuit 1 and reset circuit 2 when testing TFT arrays and semiconductors.

Finally, the voltage and other numerical parameters used in this working example are merely illustrations; these can be selected as needed in accordance with the device under test and the testing method and do not limit in any way the scope of the present invention.

What is claimed is:

1. A current/charge-voltage converter having an operational amplifier and a first capacitor connected between an input terminal and an output terminal of said operational amplifier, comprising
    a first switch, one end of which is connected to said input terminal;
    a first signal source that generates control signals for said first switch;
    a second capacitor having a first terminal, and a second terminal wherein said second capacitor is connected to said first capacitor at said first terminal; and
    a second signal source connected exclusively to said second terminal of said second capacitor.

2. The current/charge-voltage converter according to claim 1, wherein said switch comprises a transistor, and the capacitance of said second capacitor is equal to the gate-source capacitance of said transistor.

3. The current/charge-voltage converter according to claim 1, further comprising:
    a second switch, one end of which is connected to the output terminal; and a resistor, one end of which is grounded and the other end of which is connected to the other end of said first switch as well as the other end of said second switch.

4. A reset method for a current/charge-voltage converter, wherein said current/charge-voltage converter comprising:
 an operational amplifier;
 a first capacitor connected between an input terminal and an output terminal of said operational amplifier;
 a charge eliminator for said capacitor that comprises a switch connected to said capacitor;
 a second capacitor having a first end and a second end, wherein said second capacitor is connected to said first capacitor at said first end; and a signal source connected exclusively to said second end of said second capacitor,
said reset method comprising:
 bringing said switch to a connected state and eliminating the charge in said capacitor;
 opening said switch to an open state; and
 outputting signals from said second signal source.

5. The method according to claim 4, wherein said opening step and said signal output step are conducted simultaneously.

6. The method according to claim 4, wherein said capacitor is charged to a specific voltage by said signals.

* * * * *